(12) United States Patent
Chelakkat et al.

(10) Patent No.: US 12,431,551 B2
(45) Date of Patent: Sep. 30, 2025

(54) ENERGY STORAGE DEVICE

(71) Applicant: Rivian IP Holdings, LLC, Irvine, CA (US)

(72) Inventors: Kristine Wing-yin Chelakkat, San Marino, CA (US); Akshay Kishor Murkute, Irvine, CA (US); Curtis Wesley, Orange, CA (US); Michael Quincena, Los Angeles, CA (US)

(73) Assignee: Rivian IP Holdings, LLC

( * ) Notice: Subject to any disclaimer, the term of this patent is extended or adjusted under 35 U.S.C. 154(b) by 672 days.

(21) Appl. No.: 17/848,906

(22) Filed: Jun. 24, 2022

(65) Prior Publication Data
US 2023/0420759 A1 Dec. 28, 2023

(51) Int. Cl.
*H01M 10/48* (2006.01)
*G01R 31/382* (2019.01)
*H01M 10/42* (2006.01)

(52) U.S. Cl.
CPC ........ *H01M 10/488* (2013.01); *G01R 31/382* (2019.01); *H01M 10/425* (2013.01); *H01M 2010/4278* (2013.01)

(58) Field of Classification Search
CPC ............. H01M 10/488; H01M 10/425; H01M 2010/4278; G01R 31/382; G01R 31/371; G01R 31/3646; H02J 7/0048
See application file for complete search history.

(56) References Cited

U.S. PATENT DOCUMENTS

| 2014/0312802 | A1* | 10/2014 | Recker | H02J 9/02 |
| | | | | 315/291 |
| 2015/0042291 | A1* | 2/2015 | Racine | H02J 7/0048 |
| | | | | 320/137 |
| 2020/0005564 | A1* | 1/2020 | Coburn | H05B 47/105 |
| 2023/0380042 | A1* | 11/2023 | Peng | H05B 47/14 |

\* cited by examiner

*Primary Examiner* — Quan Zhen Wang
*Assistant Examiner* — Rajsheed O Black-Childress
(74) *Attorney, Agent, or Firm* — FOLEY & LARDNER LLP

(57) ABSTRACT

Systems and methods for an energy storage device having a port, a motion sensor, an ambient light sensor, a status indicator having one or more segments, and one or more processors coupled to memory. The energy storage device can determine a state of the energy storage device, detect a movement, and detect an ambient light level. The energy storage device can illuminate a status indicator. The processors determine the brightness for the number of the one or more segments based on the ambient light level, and determine the number of the segments to illuminate based on the state of the energy storage device.

19 Claims, 12 Drawing Sheets

ENERGY STORAGE DEVICE

INTRODUCTION

An energy device can include various components. Some components can interface with an energy grid.

SUMMARY

Aspects of this technical solution can be directed to status indicators for energy storage devices. For example, an energy storage indicator can communicate with a user via an LED status indicator. Upon detecting a movement, the LED status indicator can detect an ambient light level and present a display conveying a state of the energy storage device to the user, adjusted to the ambient lighting. The indication can be informed by one or more user preferences, which can impact the brightness of the device, the content displayed, or otherwise inform the presentation of the content.

At least one aspect is directed to a system including an energy storage device having a port, a motion sensor, an ambient light sensor, a status indicator having one or more segments, and one or more processors coupled to memory. The energy storage device can determine, via a processor, a state of the energy storage device. The energy storage device can detect, via the motion sensor, a movement. The energy storage device can detect an ambient light level via the ambient light sensor. The energy storage device can illuminate, responsive to the movement, a number of the one or more segments of the status indicator. The energy storage device can determine the brightness for the number of the one or more segments based on the ambient light level. The energy storage device can determine the number of the one or more segments to illuminate based on the state of the energy storage device.

At least one aspect is directed to a method performed by an energy storage device. The method can include determining a state of the energy storage device including a state of charge of the energy storage device. The method can include a provisioning of energy to a port. The method can include detecting, via a motion sensor, a movement within a threshold distance of the energy storage device. The method can include engaging, responsive to the movement, an ambient light sensor. The method can include sensing, responsive to engaging the ambient light sensor, an ambient light level. The method can include illuminating, responsive to the state of the energy storage device, a number of segments of a status indicator.

At least one aspect is directed to an energy storage device including a battery, a battery management system to monitor and control a charging or a discharging of the battery, and a wireless transceiver communicatively coupled to a microcontroller. The microcontroller is communicatively coupled to a display board having a status indicator, a motion sensor, and an ambient light sensor. The energy storage device includes a memory having stored thereupon instructions that can cause the microcontroller or other processors to receive, from the wireless transceiver, a user preference regarding an illumination of the status indicator. The instructions cause the microcontroller or other processors to detect, by the motion sensor, an approaching user. The instructions cause the microcontroller or other processors to measure, by the ambient light sensor, an ambient light level. The instructions cause the microcontroller or other processors to display, on the status indicator, a status indication based on the charging or the discharging of the battery, and the user preference.

At least one aspect is directed to a method performed by a mobile device in network communication with a server. The method can include associating the mobile device with an energy storage device comprising a battery, a status bar, and a wireless transceiver. The method can include receiving an authentication token associated with the energy storage device. The method can include detecting the wireless transceiver of the energy storage device. The method can include authenticating, based on the authentication token, a connection between the mobile device and the energy storage device. The method can include transmitting a user preference to the server or the energy storage device.

At least one aspect is directed to a method including providing a system including an energy storage device having a port, a motion sensor, an ambient light sensor, a status indicator having one or more segments, and one or more processors coupled to memory. The energy storage device can determine, via a processor, a state of the energy storage device. The energy storage device can detect, via the motion sensor, a movement. The energy storage device can detect an ambient light level via the ambient light sensor. The energy storage device can illuminate, responsive to the movement, a number of the one or more segments of the status indicator. The energy storage device can determine the brightness for the number of the one or more segments based on the ambient light level. The energy storage device can determine the number of the one or more segments to illuminate based on the state of the energy storage device.

At least one aspect is directed to an energy storage device including a motion sensor, an ambient light sensor, a status indicator to display a state of charge of the energy storage device, and one or more processors coupled to memory. The energy storage device can detect a movement with the motion sensor. The energy storage device can detect an ambient light level with an ambient light sensor. The energy storage device can display, responsive to the movement, an indication of the state of charge on the status indicator. The energy storage device can determine a state of the energy storage device via at least one of the one or more processors.

At least one aspect is directed to a method including determining, by an energy storage device, a state of the energy storage device including a state of charge of the energy storage device and providing power to a port. The energy storage device can detect a movement within a threshold distance of the energy storage device via a motion sensor. The energy storage device can engage an ambient light sensor responsive to the movement. The energy storage device can sense an ambient light level responsive to engaging the ambient light sensor. The energy storage device can display a number of segments of a status indicator, responsive to the state of the energy storage device.

At least one aspect is directed to an energy storage device including a battery, a battery management system to monitor and control a charging or a discharging of the battery and a wireless transceiver communicatively coupled to a microcontroller. The microcontroller can be communicatively coupled to a display board having a status indicator, a motion sensor, and an ambient light sensor. The energy storage device can include a memory having stored instructions thereupon that, when executed by the microcontroller or other processors, cause the microcontroller or other processors to perform operations. The operations can include a receipt of a user preference regarding a display of the status indicator from the wireless transceiver. The operations can include a detection of an approaching user by the motion sensor. The operations can include measurement of an ambient light level by the ambient light sensor. The operations can include a display of a status indication based on the charging or the discharging of the battery, and the user preference on the status indicator.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. The foregoing information and the following detailed description and drawings include illustrative examples and should not be considered as limiting.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings.

DETAILED DESCRIPTION

Following below are more detailed descriptions of various concepts related to, and implementations of, methods, apparatuses, and systems of energy storage devices. The various concepts introduced above and discussed in greater detail below may be implemented in any of numerous ways.

The present disclosure is directed to systems and methods to provide an energy storage device having status indicators to convey information to a user. The information can be provided to the user in a manner which is energy minimizing, aesthetically pleasant, or user configurable. For example, the status indicators can include LEDs which can have adjustable brightness based on an ambient environment which can reduce power usage relative to full brightness LEDs. The adjustable brightness can also avoid light pollution, and can be more visually appealing. The LEDs can be illuminated upon the detected presence of a user (e.g., based on a detection of motion or a wireless transceiver of a vehicle or mobile device). The behavior of the status indicators can be configurable based on a user preference which can further contribute to a positive user experience.

The disclosed solutions have technical advantages of reduced power usage, increasing control of data by a user, enabling additional use cases based on existing hardware, and providing additional data which can be selectively accessed. The bifurcation of data presentment between various indicators (and additional interfacing devices) can provide an improved experience for users having varied informational needs, such as a first user and a second user, or the first user and a technician.

Systems and methods of the present technical solution can include an energy storage device, other components of an energy storage system, and inputs received from a user. The energy storage device can collect various data, and user preferences. Upon a detection or other input of a user, the energy storage device can present various information associated with the energy storage device and related devices to the user.

Figure 1:
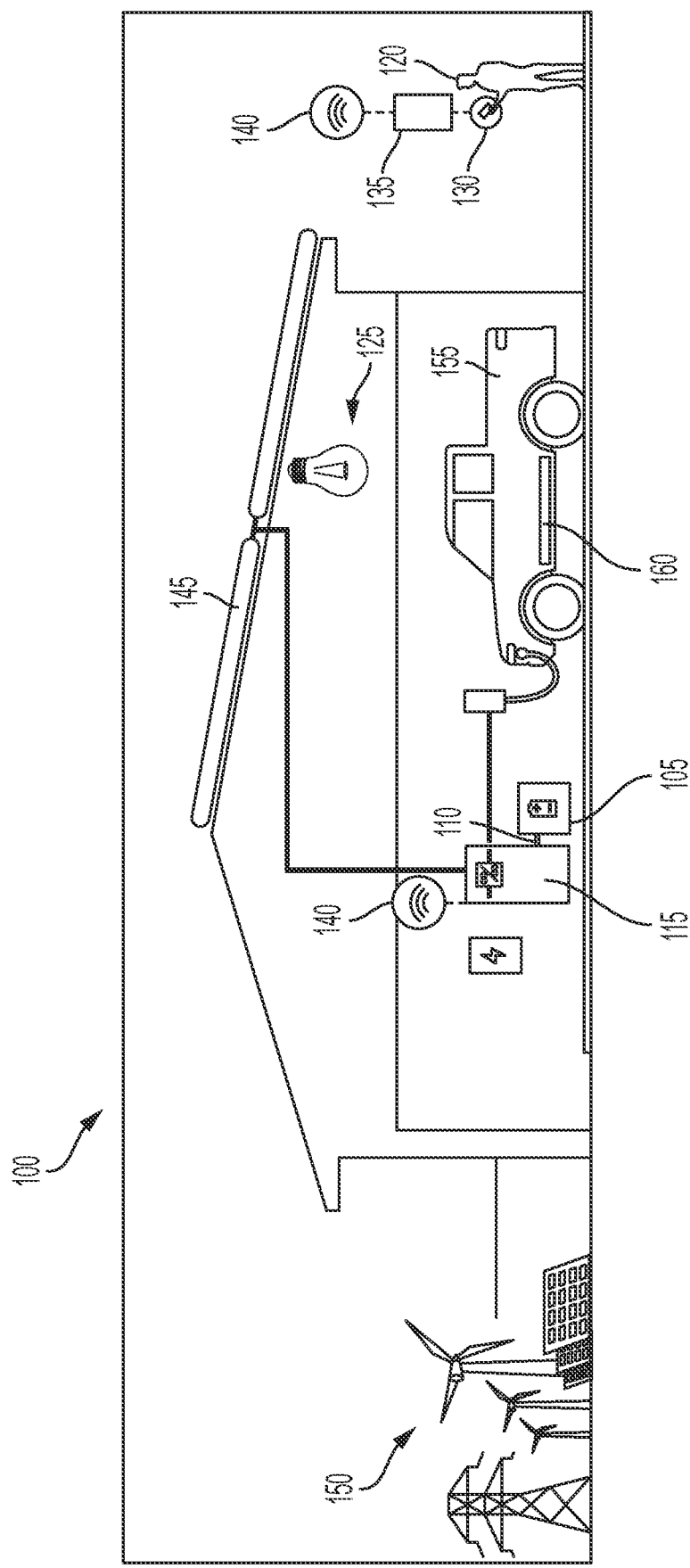
FIG. 1 depicts an energy storage system, in accordance with some aspects.

FIG. 1 depicts an energy storage system 100, in accordance with some aspects. The energy storage system 100 includes one or more energy storage devices 105. For example, the energy storage device 105 can store chemical, electrical, or mechanical energy. The energy storage device 105 can be associated with (e.g., can provide power to or from) a cabin, home, vehicle, or campsite. The energy storage device 105 can be fixed or portable (e.g., can be vehicle mounted, affixed to a permanent structure, or freely moved). For example, the energy storage device 105 can be intended for stationary operation, based on power received or delivered to the stationary location, or can be intended for movable operation (e.g., in response to a need for power at a remote location, such as a campsite.) For example, the energy storage device 105 can be an electric vehicle battery pack 160 of an electric vehicle 155 configured to provide propulsion for the electric vehicle 155 or accessory power for a user associated with the electric vehicle 155 (e.g., for lighting, cooking, and music). The vehicle battery 160 can provide energy to or from the components of FIG. 1 such as the energy storage device 105 or the grid 150.

The energy storage device 105 can include a battery pack. The battery pack can include a plurality of cells, cell balancing hardware, or a sensor suite reporting in the status of the battery and associated components. The battery pack can store energy, and the operations of the battery pack can be configured (e.g., in response to a user preference or another communication from a server). For example, a maximum and minimum charge state can be established which can be relevant to the wear of the cells of the battery or of other components. Further, the battery can exchange power with a grid according to one or more configurable settings, which can include some or all of the capacity of the battery in response to a demand reduction request.

The battery pack cells can include a thermal management system including a cold plate or another thermal management device. The battery pack can be, include, or be subdivided into modules or submodules which can include or be associated with battery cells and thermal management systems. Each battery pack, module, or submodule can include a plurality of cells such as prismatic, cylindrical, rectangular, square, cubic, flat, or pouch form factor cells.

The battery pack of an energy storage device 105 can receive power from a power grid 150. For example, the power grid 150 can be a regional power grid 150 or a micro grid 150. A regional power grid 150 is a large scale power grid 150 spanning multiple municipalities, and combining industrial scale power generation, industrial power users, and residential power users. Regional power grids 150 can involve many megawatts of power, and can include power inputs from individual operators (e.g., residential or commercial rooftop solar array 145, and wind power). Regional power grids 150 can include multiple power sources (e.g., renewable energy, fossil fuel energy, or nuclear energy). Some energy sources can be generated on demand (such as by grid 150 scale energy storage), or the activation of peak power plants that can operate in response to high demand. Regional power grid 150 operators can manage demand by providing demand reduction requests. For example, regional power grid 150 operators can contract with various customers to reduce demand in response to an explicit demand reduction request (e.g., an air conditioner can be disabled, or an industrial process can be halted in response to a demand reduction request). Some demand reduction requests can be effected by introducing variable power pricing, wherein a regional power grid 150 operator sets a price based on demand, and a consumer can reduce demand in response to an elevated price by reducing power use, or providing power to the grid 150 (e.g., by a manual process or by employing devices configured to respond automatically, such as electric vehicles 155 and energy storage devices 105).

A micro grid 150 is a power grid 150 which is, or is configured to be, disconnected from a regional grid 150. For example, an apartment building, a hospital, a campsite, a home, or a village can establish a micro grid 150. The micro grid 150 can include one or more power sources, such as an energy storage device 105, solar or wind power, or a back-up generator operating on fossil fuels. The micro grid 150 can include an electric vehicle 155 as a power source, which can, in turn, provide power to a battery of the energy storage device 105. A micro grid 150 can be a cabin having a rooftop solar array 145, an energy storage device 105, a vehicle, and various power sinks (e.g., a stereo, lighting, and cooking equipment). Power can be supplied by any of the rooftop solar array 145, the energy storage device 105, or the electric vehicle 155, and can be supplied to any of the power sinks, the electric vehicle 155, or the energy storage device 105.

A mobile device 130 of a user 120 can be associated with the energy storage system. For example, a laptop, tablet, or cellular telephone of a user 120 can be paired with the energy storage device 105 (e.g., directly or through a gateway). The mobile device 130 can store information associated with the energy storage device 105 such as user preferences, user notifications, or system logging. The mobile device 130 can be or connect to a gateway to a server, which can store information associated with the energy storage device 105, provide software updates, and monitor the operation thereof. The mobile device 130 can be associated based on a pairing or connection of the mobile device 130, or by a wired or wireless network 140 connection. The mobile device 130 can be associated with the energy storage device 105 based on an application 135 on the mobile device 130. The application data of the application 135 can include an identifier of the energy storage device 105 (e.g., a unique identifier such as a serial number, a MAC address, or another token). The mobile device 130 (e.g., the application 135 of the mobile device 130) can communicate bidirectionally with the energy storage device 105, such as to provide a location of a user 120.

The energy storage device 105 can have or detect one or more states. For example, a state can include data regarding a condition of one or more components of the energy storage device 105, an ambient environment (e.g., an ambient light level 125) associated with the energy storage device 105, one or more devices interfaced with the energy storage devices 105, or the operation of various methods by the energy storage device 105 (e.g., a power on sequence). A state can be a discrete flag or bit based on one or more thresholds, or a plurality of states can represent a condition of the device. For example, an energy storage device 105 can include a "charging" state wherein the charge rate of the battery pack is greater than zero, or can have a plurality of "charging" states associated with a plurality of charging rates (e.g., −2 kw, −1 kw, 0, 1 kw, or 2 kw). A state can be a single description of the energy storage device 105, or the energy storage device 105 can be described by a plurality of states. If a plurality of states are associated with an energy storage device 105, the various states can be depicted by the status indicator in sequence, or a state can be depicted based on an absolute or relative priority. For example, if a battery pack is at 20% SoC, discharging, and at normal operating temperature, the status indicator can display the information concerning the SoC or the discharge state, and not the information regarding the temperature state.

An energy storage device 105 state associated with another device can include connectivity with that device. For example, if an energy storage device 105 loses connectivity with a server, a mobile device 130, an inverter 115, or a grid 150 such as a rooftop solar array 145, the state of the energy storage device 105 can enter or display a state based on the loss of connectivity. Activity of another device can comprise a state. For example, the energy producing state of a wind turbine, or an access of an application 135 of a mobile device 130 can affect a state of the energy storage device 105. For example, if a facility is producing net power of 3.5 kW, which is being returned to a grid 150 (e.g., because the battery pack of the energy storage device 105 is fully charged), the energy surplus of the facility can be associated with a state of the energy storage device 105. If a user 120 opens an application 135 associated with the energy storage device 105, the state of the energy storage device 105 can be updated and communicated via the status indicators (e.g., to alert nearby persons that changes in status indicators can relate to a user preference entered by the user 120). Various additional states are described throughout this disclosure; the various conditions, operations, and sequences performed by or associated with the energy storage device 105 can be or can influence a detection of a state of the energy storage device 105.

States can include a state of charge (SoC) of an energy storage device (e.g., a SoC of a battery cell or pack), a status code, service code, or a mode of operation. For example, the energy storage device can measure a current or a voltage (e.g., instantaneously or over time) to determine a SoC of the battery pack, and report the battery pack information. A mode of operation can include charging, discharging, updating, installing, communicating with one or more devices, testing, and additional modes, some of which are explicitly disclosed herein. A status code can be any report of the status of the energy storage device 105 including a status bar or additional LED status indicators, the mobile device 130, or the server, including any animations, or user preferences. The status code can be detected based on one or more states associated with the energy storage device 105.

The energy storage device 105 can detect a power availability event. A power availability event can be responsive to a change in state detected by the energy storage device 105, which can be responsive to a message or interrupt, polled at a regular frequency, or polled in response to a request. For example, a processor of the energy storage device 105 can receive an interrupt responsive to a loss of power on an input port 110. The energy storage device 105 can poll the state of a power input port 110 at a regular period (e.g., 100 ms, 1 s, or 1 minute), or in response to a request (e.g., of a user 120, conveyed by an application 135 of a mobile device 130 associated with the energy storage device 105). For example, a power availability event can be the availability or unavailability of power at a port 110 (e.g., power can be available at a first port 110, which is electrically coupled to a rooftop solar array 145, and at a second port 110, which is electrically coupled to a regional grid 150).

The availability or unavailability of power can be determined according to a voltage, a frequency, a power quality, or a message and can be an instantaneous determination or be based on multiple measurements over time. For example, the availability of power can be based on the detection of a brownout (e.g., a reduced voltage), the time of a brownout (e.g., a transitory sag which can be associated with a local demand spike, or a sustained brownout which can be associated with a power grid 150 failure).

The power availability event can be a demand reduction request associated with a power grid 150. For example, an operator of an electric grid 150 can provide a notification to the energy storage device 105. The demand reduction request can be a single priority indication, or can include additional priorities. For example, a demand reduction request can be prioritized according to a plurality of urgencies of a predefined message (e.g., a demand reduction request can include an indication of a low, medium, or high priority). The demand reduction request can include pricing information. For example, an account associated with the energy storage device 105 can be given a credit in response to reducing demand, or the pricing of power can otherwise incentivize the reduction of power. For example, a price of energy can be 10 cents per kwh, and a demand reduction request can be or comprise an adjustment of the price of energy to 15 cents per kwh. A power availability event can be a demand increase request. For example, a regional grid 150 operator can operate power production facilities which cannot be quickly disengaged in response to a drop in power, and thus can request users increase energy usage. A grid 150 operator can forecast a demand reduction request, (e.g., in response to a weather forecasting high temperatures at 3 PM), and can request users use power at 10 AM (e.g., in order to displace demand in the afternoon). Such a demand increase request can be communicated based on a predefined message, or a price update (e.g., a price reduction to 5 cents per kwh).

A power availability event can be in response to a local stimulus. For example, a power availability event can indicate that power is available (or unavailable) at a solar power array or wind power array, or that the battery has reached a SoC. For example, a power availability event can indicate that the battery has reached a SoC of 0%, 20%, 50%, 80%, or 100%.

Figure 2:
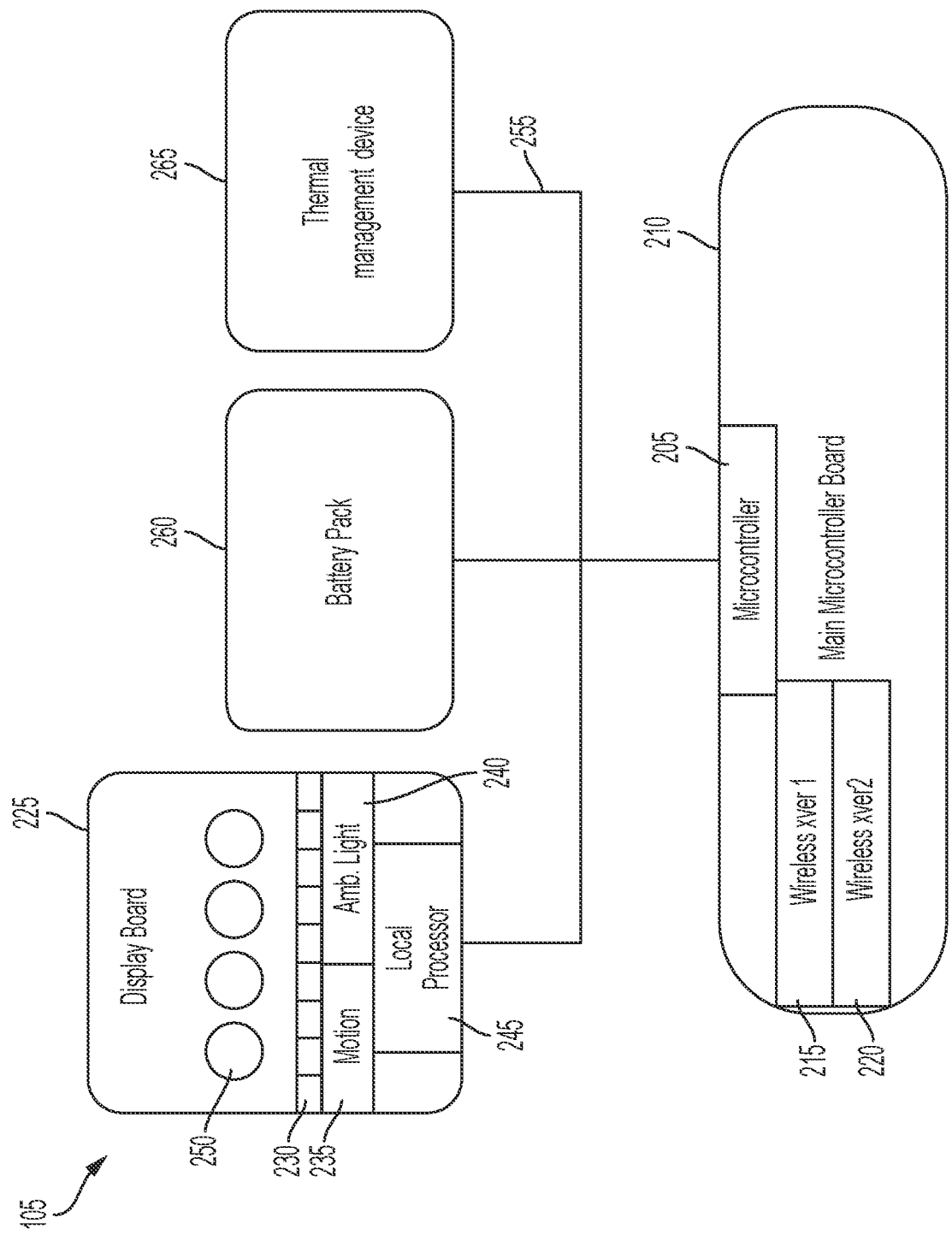
FIG. 2 is a block diagram of an energy storage device, in accordance with some aspects.
Figure 5:
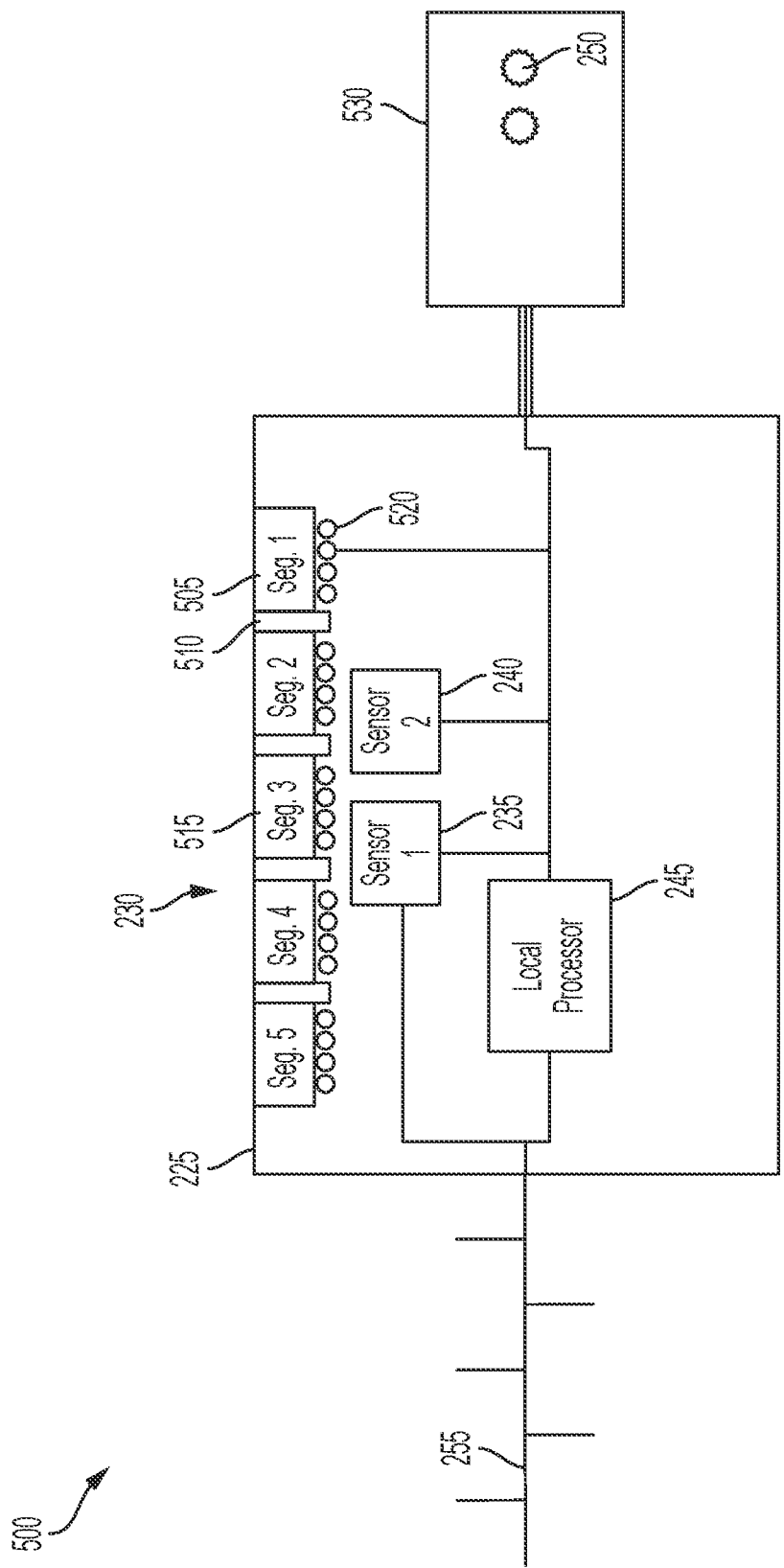
FIG. 5 is a block diagram illustrating a display board, in accordance with some aspects.

FIG. 2 is a block diagram of an energy storage device 105, in accordance with some aspects. The energy storage device 105 includes an assortment of system subcomponents. The system subcomponents can be organized, interconnected and grouped according to various schemas (e.g., physical or logical). The organization, interconnections, and grouping depicted herein are one such example, and are not intended to be limiting. For example, FIG. 5 provides another somewhat different depiction, in accordance with some aspects.

The energy storage device 105 can include various sensors such as voltage sensors, pressure sensors, temperature sensors, and current sensors. The energy storage device 105 can include one or more motion sensors 235. Motion sensors 235 can be of various designs and modes of operation. For example, the energy storage device 105 can include a passive infrared sensor, which can detect the presence of a temperature profile of a human or a vehicle, or a change in that presence. Motion sensors 235 can detect movement based on a Doppler effect as in a microwave motion sensor 235, or an ultrasonic motion sensor 235. A motion sensor 235 can detect a change in sensor input or a presence in an image, as in video motion sensor 235. Some motion sensors 235 include redundant components (e.g., of various technology types), which can reduce spurious detections of environmental noise (e.g., the movement of tree branches or squirrels). Such redundant sensors can include an order of activation which can reduce power use. For example, a passive infrared motion sensor 235 can detect a possible movement, whereupon a higher power microwave motion sensor 235 can be activated to confirm the movement, and indicate the detection.

The motion sensors 235 can detect a movement. For example, the motion sensors 235 can detect a movement directly, infer movement from the presence of a person, vehicle, or mobile device 130, detect a change of position of a person, vehicle, or mobile device 130, (e.g., based on a change in signal strength, a triangulated position, or a Doppler effect). The movement can be within a threshold distance the energy storage device 105. For example, the detection capability of a motion sensor 235 can be a threshold, and any detected movement can be in excess of the threshold. A threshold can be established below the maximum detectability of a device. For example, a motion sensor 235 can detect movement within and beyond a threshold distance. The threshold distance can be based on a line of sight or otherwise be directional. For example, a threshold associated with an ultrasonic sensor can be greater with a reflected signal than with a direct signal, and a passive infrared sensor can have a directionality component (e.g., movement at certain heights or in certain directions can more readily generate a response from the passive infrared sensor. The sensitivity of a sensor can be adjusted as will be further discussed with reference to FIG. 5, with regards to user preferences defining a sensitivity or a calibration.

The energy storage device 105 can include one or more ambient light sensors 240, for example, the energy storage device 105 can include a phototransistor, photodiode, or photonic integrated circuit. The ambient light sensors 240 can detect an ambient light level 125, for example, the ambient light sensors 240 can perform an instantaneous measurement of an ambient light, a time averaged measurement or can perform multiple measurements of an ambient light (e.g., one sensor can perform multiple samples, or multiple sensors can perform at least one sample). The sensor readings can be averaged to determine an ambient lighting. The ambient light sensors 240 can be selectively engaged. For example, an ambient light sensor 240 can be engaged in response to an activation of the motion detector, or the presence of a mobile device 130. Selective engagement of the ambient light sensor 240 can reduce a power use associated with the sensor, increase a lifespan of the sensor, or reduce overall system processing. The ambient light sensors can determine an average or instantaneous brightness which may indicate a state of occupancy or control a brightness of indicators, such as the indicators of the energy storage device.

The motion sensor 235 and ambient light sensor 240 can be connected to a local processor 245 of a circuit board. The local processor 245 can interface with additional system subcomponents by one or more connections including a wired network connection 255. The wired network connections 255 can include one or more processors connected to one or more devices. The wired network connections 255 can include multi-node connections, as well as one or more point to point links, and analog or digital input or output lines. For example, the local processor 245 can interface with a status bar 230 comprised of a plurality of segments, one or more additional LED status indicators 250, and other components of a display board 225. The local processor 245 can interface with a microcontroller 205 of a main microcontroller board 210, which can communicate with various additional elements of the energy storage device 105, such as a battery pack 260, a thermal management device 265, or wireless transceivers which can form wireless networks (e.g., a first wireless transceiver 215 can be a Bluetooth transceiver, and a second wireless transceiver 220 can be a Wi-Fi transceiver). The local processor 245 or the microcontroller 205 can control or monitor the various components herein. The adopted nomenclature of the local processor 245 and the microcontroller 205 is merely to clearly refer to the devices depicted in FIG. 2. Variants of the present disclosure can use one or more processors (which can be referred to by various terms, such as processors, microcontrollers, CPUs, status indicator controllers, or embedded controllers).

The energy storage device 105 can include one or more network. The networks can be a wireless network connected to the wireless transceivers of the energy storage device 105, such as the first wireless transceiver 215 and the second wireless transceiver 220. For example, the energy storage device 105 can interface with a server, a mobile device 130 associated with a user 120, diagnostic tools, additional energy storage devices 105 or related devices (e.g., electric vehicle chargers, inverters 115, or wind turbines) over the wireless transceiver. The network can be a local network such as a Bluetooth network, a local Wi-Fi network, a ZigBee network, or can be a wide area network, such as the internet or a cellular network. The energy storage device 105 can receive a user preference via the network. For example, the user preference can relate to the operation of the status bar 230, or to other operating characteristics of the energy storage device 105. For example, the user 120 can elect to receive a notification responsive to a detection of movement based on a time of day or the location of a mobile device 130.

The energy storage device 105 can include one or more wired networks or network connections 255. For example, the energy storage device 105 can include network connections 255 or networks having universal serial bus (USB), serial, controller area network (CAN), local interconnect network (LIN), or Ethernet ports. For example, the battery pack 260, a thermal management device 265 such as a pump or fan, a diagnostic port, and one or more processors of the energy storage device 105 can be connected to the network connections. The wired devices can communicate by one or more pins. For example, the devices can communicate over a LIN or other protocol over a single pin, and a return path. The single pin can be shared with a power line (e.g., a power supply or return line). The various wired and wireless networks disclosed herein can be substituted according to a desired mobility, range, and interoperability of the device. For example, the various internal components described herein can be connected via Bluetooth, or the mobile device 130 or server can be connected to a wired Ethernet port.

The network connections 255 can include a connection to a thermal management system of the energy storage device 105. For example, the thermal management system can include a fluid such as a gas or liquid to redistribute heat within the energy storage device 105 or between the energy storage device 105 and an environment (e.g., through a heat exchange or heatsink). The fluid can draw heat away from, between, or to various components of the energy storage device 105. For example, the energy storage device 105 and various components thereof, some of which are specifically described herein, can have one or more operating or absolute temperatures. The temperatures can include an excursion maximum or minimum temperature, a long term maximum or minimum temperature, a maximum or minimum temperature associated with a first set of performance characteristics, or a maximum or minimum temperature associated with a second set of performance characteristics. The thermal management system can monitor the temperature of various components of an ambient environment, (e.g., via one or more thermocouples, thermistors, or via a messages received over a network). The thermal management system can determine or monitor various states. For example, if a battery pack temperature is below a desired temperature, and a heat source is available (e.g., a heat source internal to the energy storage device 105, or an ambient temperature), the fluid can be circulated to increase the temperature of the battery. Likewise, if the battery pack 260 is above a desired temperature, and a heat sink is available, the fluid can be circulated to remove temperature from the battery pack 260. The performance of the battery pack 260 can be variable based on a temperature. For example, the battery pack 260 can be capable of 10 kW output at temperature range of 0° C. to 50° C., and a 7.5 kW output at a temperature range of −20° C. to 70° C. The various states and capabilities associated with one or more thermal management devices 265 of the thermal management system can be indicated to one or more users through the status indicators.

The status indicator can convey information to a user 120 or to a device. For example, an application 135 of a mobile device 130 can convey a request to the user 120 from the server, the microcontroller 205 or the local processor 245 to indicate the status of the additional LED status indicators 250 during an installation or diagnostic session. The user 120 can manually enter the state of the status indicators or the status indicators can pass data to the mobile device 130 through a camera associated with the mobile device 130. For example, a camera associated with some mobile devices 130 can reliably detect data occurring at several Hz, or tens of Hz. The information depicted by the status indicator can be a status code. The status code can be or indicate a status condition. For example, an internal component of the energy storage device 105 can require service (e.g., as a part of a routine preventative maintenance program, in response to a message originating from the server, or in response to a detected condition).

The status condition can be qualified as a mask-able. For example, the battery pack 260 of the energy storage device 105 can have a decreased capacity. The decreased capacity can be identified as an internal condition, and be reported for analytics or prognostic purposes. For example, the battery pack 260 can be in a low temperature mode or a high temperature mode, and the reduced battery pack 260 capacity can be intentional or expected. Thus, the decrease in battery pack 260 capacity can be masked. Additional statuses can be masked. For example, technical data that can be of interest to a technician, but can be intrusive to a user 120, or otherwise detract from an overall user experience, and can be masked. A user preference can indicate whether a status condition is mask-able. For example, a plurality of status conditions can be aggregated into one or more logging levels which can be selectable by a user 120.

The mask-able condition can be displayed on the additional LED status indicators 250. For example, a transient, minor, or technical condition can be useful to a technician or installer, but can be of little interest to many users. For example, when the energy storage device 105 is first connected to power, the energy storage device 105 can pass through a series of states, such as a state of connecting to a network (e.g., a WiFi, Bluetooth, or cellular network) and executing a power on self-test (and various sub-operations thereof). The energy storage device 105 can conduct a software update, load balance cells of the battery pack 260, and other conditions which can be of interest to a technician, or other trained user. Some mask-able conditions can relate to a lack of communication to another device such as a server or a mobile device 130 of a user 120. The additional LED status indicators 250 can provide a user 120 a quick and easy way to describe one or more states which can lead to a lack of communication. For example, a color, status, and pattern of an LED (e.g., a first solid red LED, and a second LED alternating between three green blinks, and a blue on-state) can indicate a failure of a gateway to assign the energy storage device 105 an internet protocol address.

The status condition can be qualified as a non-mask-able. Some conditions can require an interaction from the user or from a technician, or can be of particular interest to a user 120. For example, an unavailable energy storage device 105 can qualify a condition as non-mask-able (e.g., due to an unavailability of the grid 150 and a state of charge of the battery, another condition of the energy storage device 105, or an ambient environment). A non-mask-able status condition can relate to a status arising after or during an installation. For example, an energy storage device 105 can be installed as a part of a larger installation, which can include solar panels, an inverter 115, or additional components. If a component of the installation is absent (e.g., due to a shipping delay, or a pending permit inspection), the energy storage device 105 can be placed into an inoperable state (e.g., can lack a ground connection or a return line connection). While in the inoperable state, the status condition can be determined to be non-mask-able (e.g., because the unavailability of the device can be of interest to a user 120).

The non-mask-able condition can be displayed on the status bar 230. For example, the status bar 230 can display a status message intended to draw an attention of the user 120. For example, a red or white solid or flashing display can alert a user 120 to inspect or service the energy storage device 105. The energy storage device 105, or server can convey, or attempt to convey a notification to the user 120 or server in response to the condition. Additional data, related to the non-mask-able condition, or another condition of the energy storage device 105 can be displayed on the additional LED status indicators 250. For example, the non-mask-able condition can be a single indication of the energy storage device 105 requiring attention, or a limited number of indications of the energy storage device 105 requiring attention (e.g., relating to a communications subsystem, a thermal management subsystem, or an ambient condition, such as a temperature). The additional LED status indicators 250 can display additional information (e.g., a server has not been reachable for a time exceeding a threshold, a pump or other thermal management device 265 of the thermal management system requires servicing, or a sensed ambient temperate exceeds specifications for the operating state of the energy storage device 105, respectively).

Figure 3:
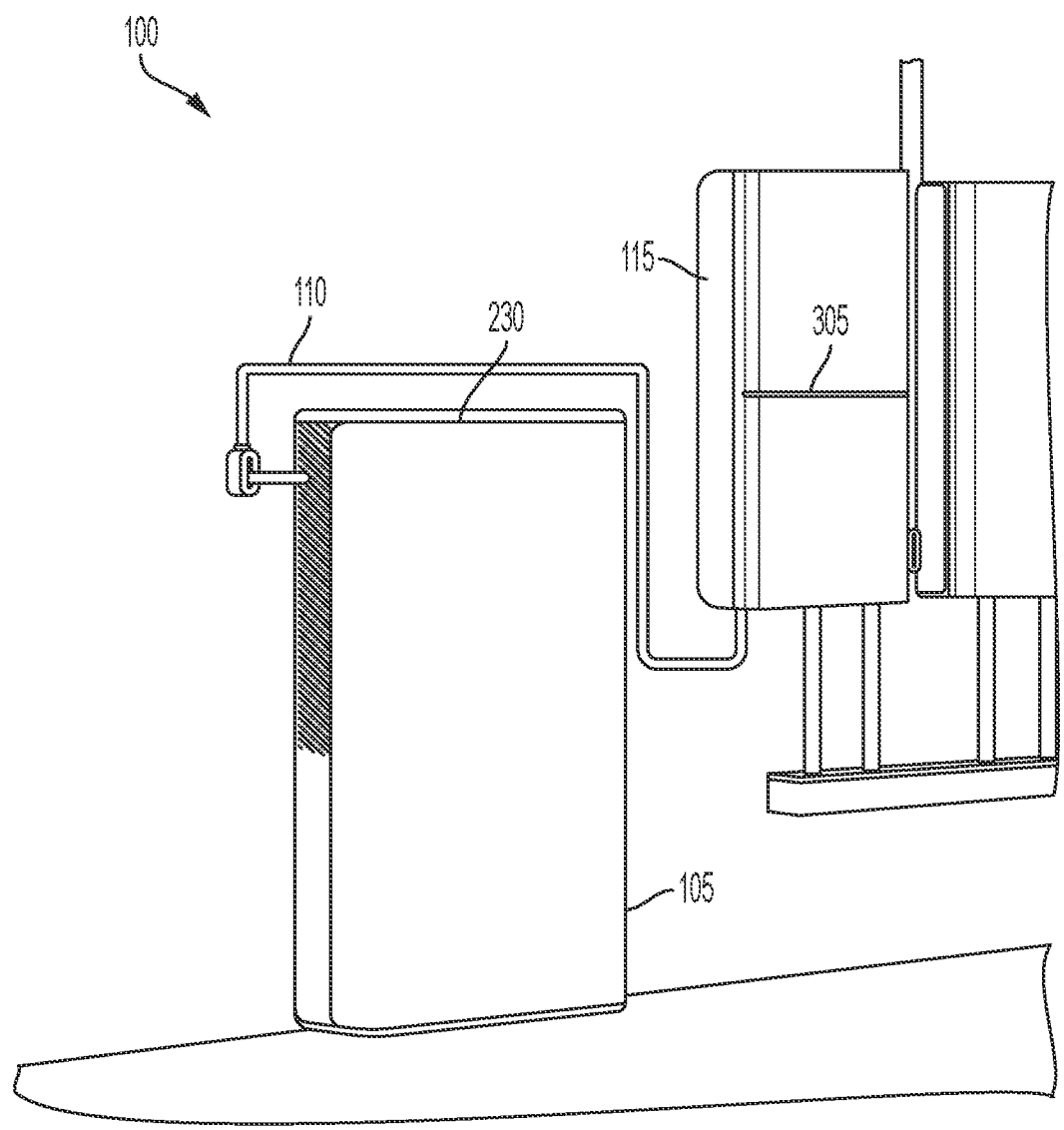
FIG. 3 is a perspective view of an energy storage device, in accordance with some aspects.

FIG. 3 is a perspective view of an energy storage device 105, and other components of an energy storage system in accordance with some aspects. The depicted energy storage device 105 is depicted having a port 110 connected to an inverter 115. The energy storage device 105 can have a status bar 230 disposed along a seam of the device, which can be associated with an inverter status indicator 305. For example, various status indicators can be synchronized, combined, or otherwise configured to operate cooperatively.

The energy storage device 105 can include one or more ports 110. For example, the energy storage device 105 can include one or more power input ports 110, or one or more power output ports 110. A port 110 can be bidirectional. For example, a port 110 can connect the battery to an inverter 115, which can supply power to the inverter 115, or receive power through the inverter 115. The inverter 115 can be a component of the energy storage device 105 or another device connected to an outward facing port 110 of the energy storage device 105. The energy storage device 105 can interface with one or more inverters 115 through an output port 110 to provide power to the inverter 115, and a separate input port 110 to receive power from the inverter 115. The energy storage device 105 can include internal power ports 110 to provide power to components of the energy storage device 105, as discussed with regards to FIG. 4. The energy storage device 105 can include one or more communication ports 110 (e.g., wired or wireless transceivers), as is further discussed herein.

The energy storage device 105 can provide power to a port 110 based on a power availability event. For example, the energy storage device 105 can power a load (e.g., a cabin) in response to a power availability event indicating a loss of power from a regional grid 150, or a micro grid 150. The energy storage device 105 can power the load in response to a power availability event associated with the charge state of the energy storage device 105 (e.g., in response to a minimum SoC, the energy storage device 105 can provide power to the load). The energy storage device 105 can provide power to various ports 110 based on various power availability events. For example, the energy storage device 105 can include a first output port 110 and a second output port 110. In response to a SoC of 80%, the energy storage device 105 can output energy to the first output port 110 (e.g., an output port 110 for lighting and limited accessory power), and to a second output port 110 (e.g., to the remaining circuits associated with a load). Upon a power availability event indicating the SoC to be at 20%, the energy storage device 105 can continue to power the first output port 110 and cease to provide power to the second output port 110.

The energy storage device 105 can provide power to a port 110 to transfer energy to or from a grid 150 based on a power availability event. For example, upon a power reduction request, the energy storage device 105 can provide power to a port 110 connected to a grid 150 (e.g., directly or through an intermediate device). Upon a detected blackout (e.g., detected based on a received communication, or based on sensing a grid power loss), the energy storage device 105 can disconnect power from a port 110 connected to the grid 150 (e.g., to avoid energizing lines that personnel may be working on).

Figure 4:
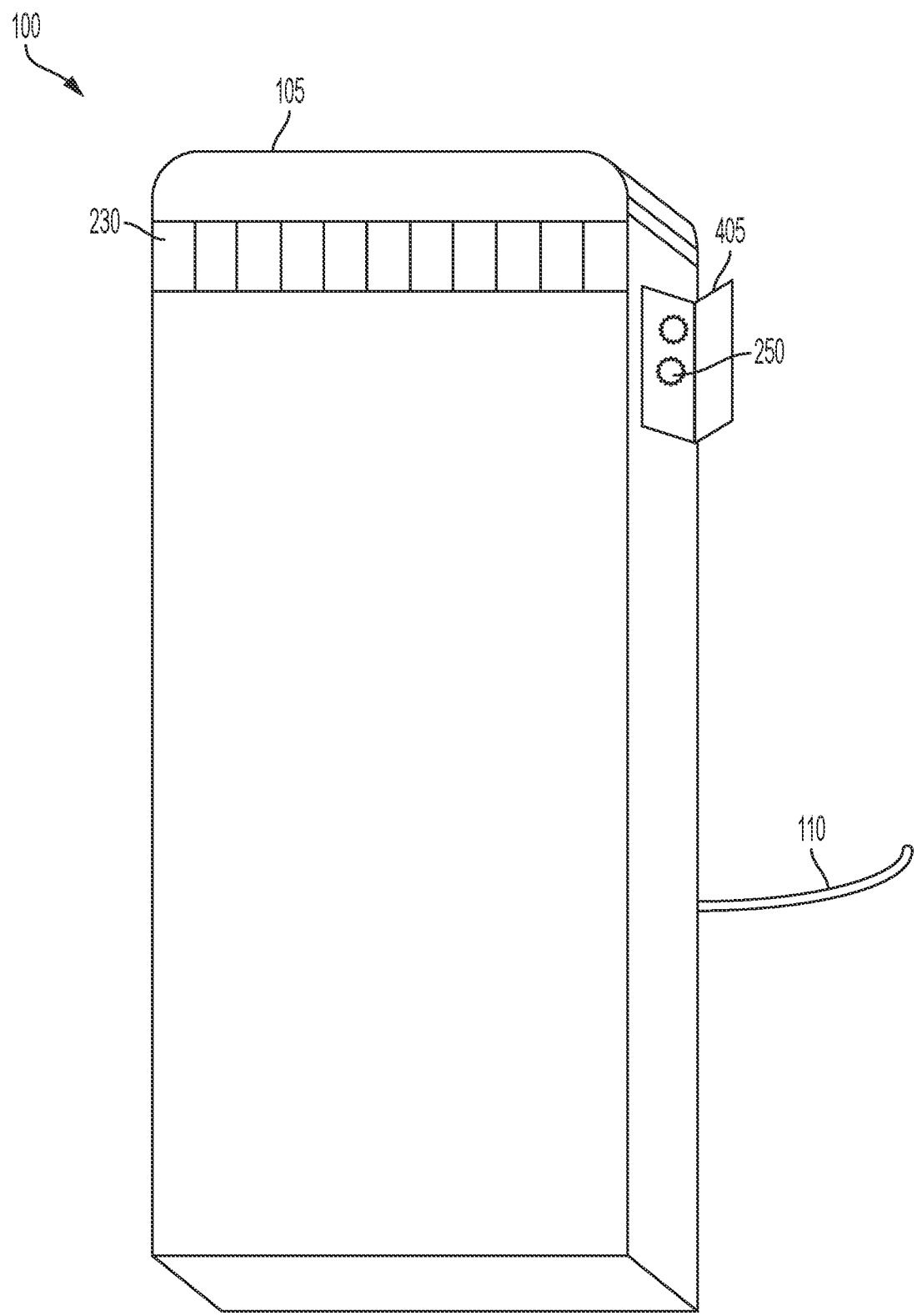
FIG. 4 is another perspective view of an energy storage device, emphasizing the status indicators, in accordance with some aspects.

FIG. 4 is a perspective view of system 100 including an energy storage device 105, emphasizing the status indicators, in accordance with some aspects. For example, the status indicators can display various patterns based on the state of the energy storage device 105 such as a state associated with various ports 110 for input or output of energy or data.

The energy storage device 105 can include one or more status indicators. For example, the status indicator can be or include an integrated liquid crystal display, a GUI associated with a mobile device 130 for presentation to a user 120, or an LED indicator. The status indicator can be disposed along a surface of the energy storage device 105, within the energy storage device 105, or at a remote display (e.g., on a computing device). The status indicator can be disposed horizontally, vertically, or diagonally along a surface of the energy storage device 105. The status indicators can be circular, rectangular, or form one or more characters or words. The status indicator can be human readable or machine readable (e.g., can contain characters or QR codes).

The status indicator can receive power provided by the battery pack 260. For example, the status indicator can include a power input from the battery in addition to, or instead of, another power input such as a power input supplied by a power grid 150. Thus, upon a failure or removal of a power grid 150 or another external power source, the status indicators can continued to be powered. Additional components of the energy storage device 105 can receive power from the battery pack 260. For example, various processors, sensors, transceivers, and thermal management devices 265 can receive power from the battery pack 260, and can continue to operate upon the removal of an external power source (e.g., can process, display, and communicate the removal of the external power source, or information associated with the removal of the power source). The energy storage device 105 can contain circuitry to interface a battery voltage rail associated with the battery pack 260 with one or more auxiliary voltage rails associated with the processors, sensors, transceivers, and thermal management devices 265.

The segments can have one or more brightness settings. For example, a brightness setting can be based on the ambient light to maintain a visibility of the segments in bright environments (on a sunny day, or when vehicle headlights are shining on the energy storage device 105), and lower power use and avoid nuisance light in dark environments.

The status indicator can include one or more additional LED status indicators 250. The additional LED status indicators 250 can be combined with or separate from the status bar 230. For example, the additional LED status indicators 250 can share a lens or other optical elements with the status bar 230. The additional LED status indicators 250 can be displayed prominently. The additional LED status indicators 250 can be concealed during normal operation. For example, the additional LED status indicators 250 can be disposed behind a removable panel 405. The removable panel 405 can be opaque to block any light from the additional LED status indicators 250 when in normal operation. The additional LED status indicators 250 can be configured to display continuously, or upon the removal of the removable panel 405. The additional LED status indicators 250 can be lower power or lower intensity than the segments of the status bar 230. For example, the additional LED status indicators 250 can be designed for short distance visibility by a technician.

FIG. 5 is a block diagram illustrating a display board assembly 500, in accordance with some aspects. The display board assembly 500 includes one or more network connections 255 to additional components of an energy storage device 105 or an energy storage system, which may be electrically or communicatively connected to a display board 225. The display board 225 can host one or more portions of the status indicator.

The status indicator can include one or more segments. The segments can be joined continuously to form a status bar 230 having the appearance of a single component source when each segment of the LED is illuminated, or can clearly demarcate the various segments. The status bar 230 can be prominently displayed, or can be aligned with a seam of the device to deemphasize the presence of the light bar when the light bar is not illuminated. For example, the light bar may not be readily perceived when no segment of the light bar is activated. The segments can each, or can all be covered with a lens, such as a smoked, frosted, or satin finish lens which can aid the appearance of a continual segment of light (e.g., between the segments, or within segments including one or more light sources such as LEDs). The status bar 230 or each segment of the status bar 230 can include a light source 520 such as a neon tube, an incandescent bulb, or one or more LEDs. For example, each segment of the light bar can include a plurality of LEDs disposed linearly to distribute the light output throughout the segment.

The one or more segments can be linearly disposed. For example, the segments and the light source 520 within the segments can be linearly disposed in a same direction to create a continuous line of light of apparently even intensity. Moreover, the segment boundaries can include opaque elements along one or more edges to prevent overflow beyond a segment. For example, a first segment 505 of the status bar 230 can be illuminated, and an adjacent second segment 515 of the status bar 230 is can remain unilluminated. An opaque element 510 disposed along a boundary of the first segment 505 and second segment 515 can reduce or eliminate light from the first segment 505 infiltrating the second segment 515, to create a clear segment to segment demarcation. The segments can include a light passage between adjacent segments to permit the passage of light between segments to create an appearance of soft edges of the segments. The LEDs can be of a single color, or can be multicolor LEDs (e.g., can be a cluster containing red, green, and blue (RGB) LEDs) capable of displaying multiple colors.

The status indicator can be configurable based on a user preference. For example, a user preference can be manually selected by a user 120, or can be based on user information. A display color of the segments can be associated with the user preference. For example, if a user account associated with a user 120 is associated with a vehicle, the color of the vehicle can be selected as the color of one or more portions of the LED indicator, such as the status bar 230 (e.g., via a manual selection of the user 120 or automatically based on a detection of the vehicle). The user preference can control a brightness of one or more segments of the status indicator (e.g., to avoid light pollution when stargazing, or when positioned near a bedroom window). The user 120 can select a sensitivity, offset, or engagement of various sensors such as a motion sensor 235 or an ambient light sensor 240. Additional user preferences can include the various additional configuration options depicted herein, which may be explicitly referred to as a received user preference or may otherwise indicate an optional configuration of the energy storage device 105.

The preference can be received over a wireless network. For example, a user preference can be received from a computing device associated with a user 120 over a wireless transceiver. The computing device can be a desktop computer or mobile device 130 of the user 120, which is collocated (e.g., within a range of wireless transceivers of the device) connected to the energy storage system based via wireless protocol such as Bluetooth or WiFi. The preference can be received from a remote device (e.g., a device of the user 120, or a server communicatively coupled with a device of the user 120) through a network comprising additional devices (e.g., the internet). The user preferences can be stored on the device, on the user device, or an another device associated with the user 120 (e.g., the server). For example, a local processor 245 or another processor can contain memory to store a user preference (e.g., in volatile or nonvolatile memory).

The segments can be individually selectable, for example, the segments can be individually illuminated or controlled (e.g., a brightness thereof). The segments can be selectable by any of an animation, a user 120 (e.g., by user preferences), or a display state. For example, each segment can be configured to display separate information, or can be combined to form user codes, which can aid a user 120, such as during an initial installation. The segments can display any information associated with the energy storage device 105. For example, the segments can display information related to the connectivity of the device (e.g., communicative connections, electrical connectivity with a ground, a grid 150, or an energy sink).

The display board 225 can also include one or more additional LED status indicators 250, as have already been described (e.g., with respect to FIGS. 2 and 4). The additional LED status indicators 250, or other elements of the display board assembly 500 (and of the energy storage system) can be disposed on additional or boards, flex circuits, bulkhead assemblies, otherwise secured to the energy storage device 105. For example, the additional LED status indicators 250 can be placed on an ancillary circuit board 530 and mounted away from the status bar 230 to avoid interference of light between the status bar 230 and the additional LED status indicators.

Figure 6:
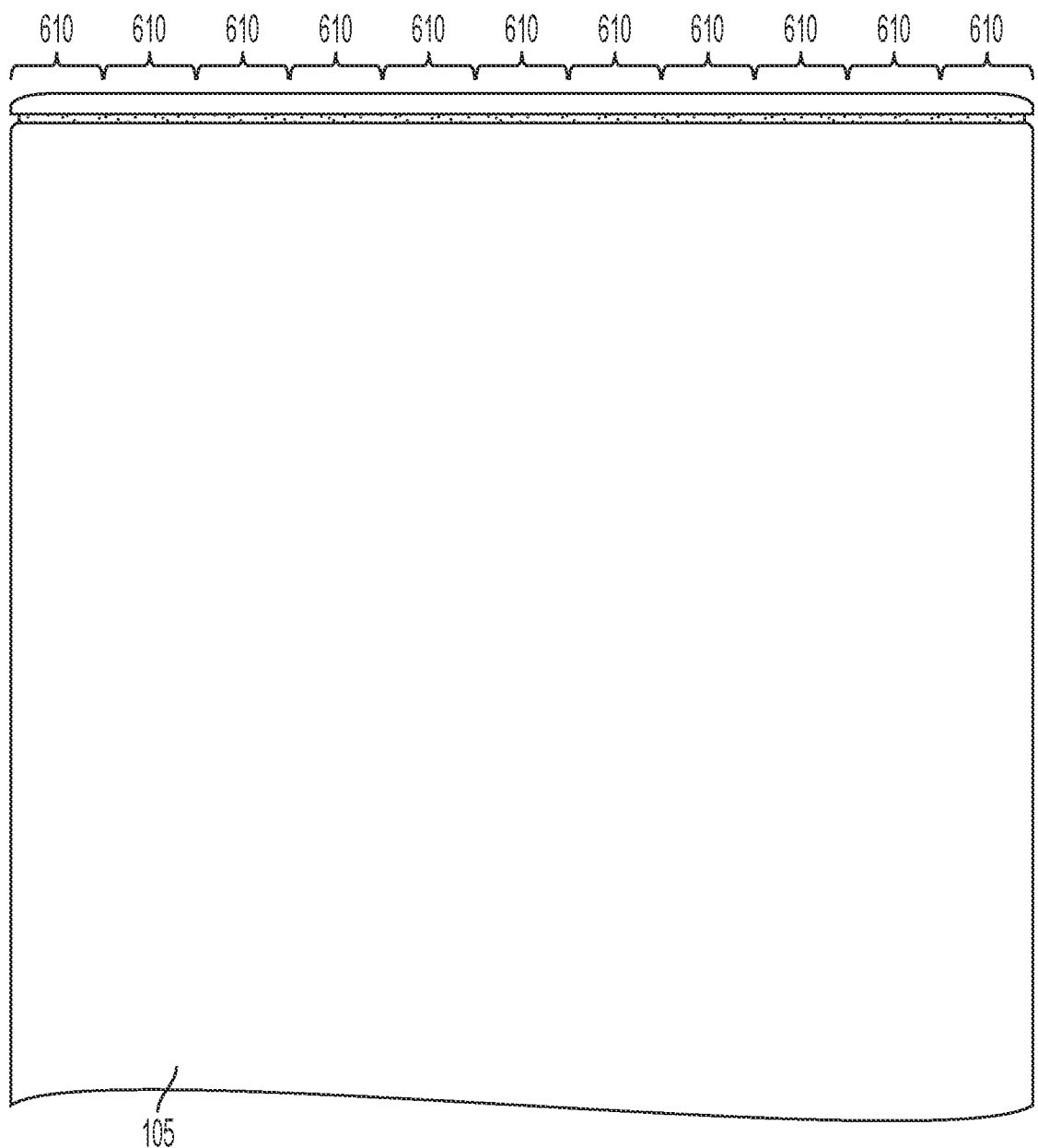
FIG. 6 depicts an animation of the status indicators of an energy storage device, in accordance with some aspects.

FIG. 6 depicts an animation of the status indicators of an energy storage device 105, in accordance with some aspects. The depicted energy storage device 105 includes a status bar 230 having eleven segments. The energy storage device 105 can alternate segments to generate an animation. These animations can involve one or more segments (e.g., at a given time, or in total). For example, an animation can commence with a central segment 635 alternating between an illuminated and non-illuminated state. The alternations can be discrete changes at a fixed brightness (e.g., blinking), or can comprise a series of incremental brightness settings between an illuminated and non-illuminated state (e.g., can fade in or out). The animations can begin with another segments, such as the leftmost segment 610, the rightmost segment, 660, or any other segment (615, 620, 630, 640, 645, 650, or 655). An animation can begin with a plurality of segments. For example, the animation can begin with the leftmost segment 610 and rightmost segment 660, with all segments illuminated, or another subset of the segments.

The animation can be related to the charging or discharging of the battery. For example, a charging battery can be indicated by the segments of the status bar 230 incrementally lighting (e.g., from left to right, from right to left, or from center outward). For example, one or more segments at a time can be illuminated to generate an illusion of leftward or rightward motion (e.g., at a single brightness, or with multiple brightness's to generate a fading effect). A user 120 can associate the leftward or rightward motion with a charging or discharging of the battery. The segments can be used to indicate a current state of charge of the battery. For example, if the battery is about 65% charged, then about 65% of the segments (e.g., 7 of 11, or 2 of 3) can be illuminated. Animations can be combined. For example, a steady state display can indicate a state of charge of the energy storage device 105, and an illusion of movement can be generated to indicate charging or discharging of the battery. (e.g., if the battery has a state of charge of 65% and is discharging, about 65% of the segments can be illuminated at a first brightness, and an illusion of motion can be generated on all the segments, the remaining about 35% of the segments, or the illuminated segments at a second brightness).

The animation can be selected by or generated based on a user preference. For example, the user 120 can select an animation, a theme of animations, a default color, a speed of animations, a brightness of one or more components of the animation such as a maximum or minimum brightness, or can configure a user configured animation. Animations can be repeated, or can be alternated. For example, upon detecting an approach of a user 120, the energy storage device 105 can display a welcome animation, followed by another animation or display comprising a status of the device. Upon a halt of a display of the status bar 230 (e.g., due to a user preference, a time in an on state, or a time since a most recent detection), the status bar 230 can display a goodbye animation, which can alert a user 120 that the shutoff of the status bar 230 is expected, or provide a pleasant aesthetic for the user 120.

Figure 7:
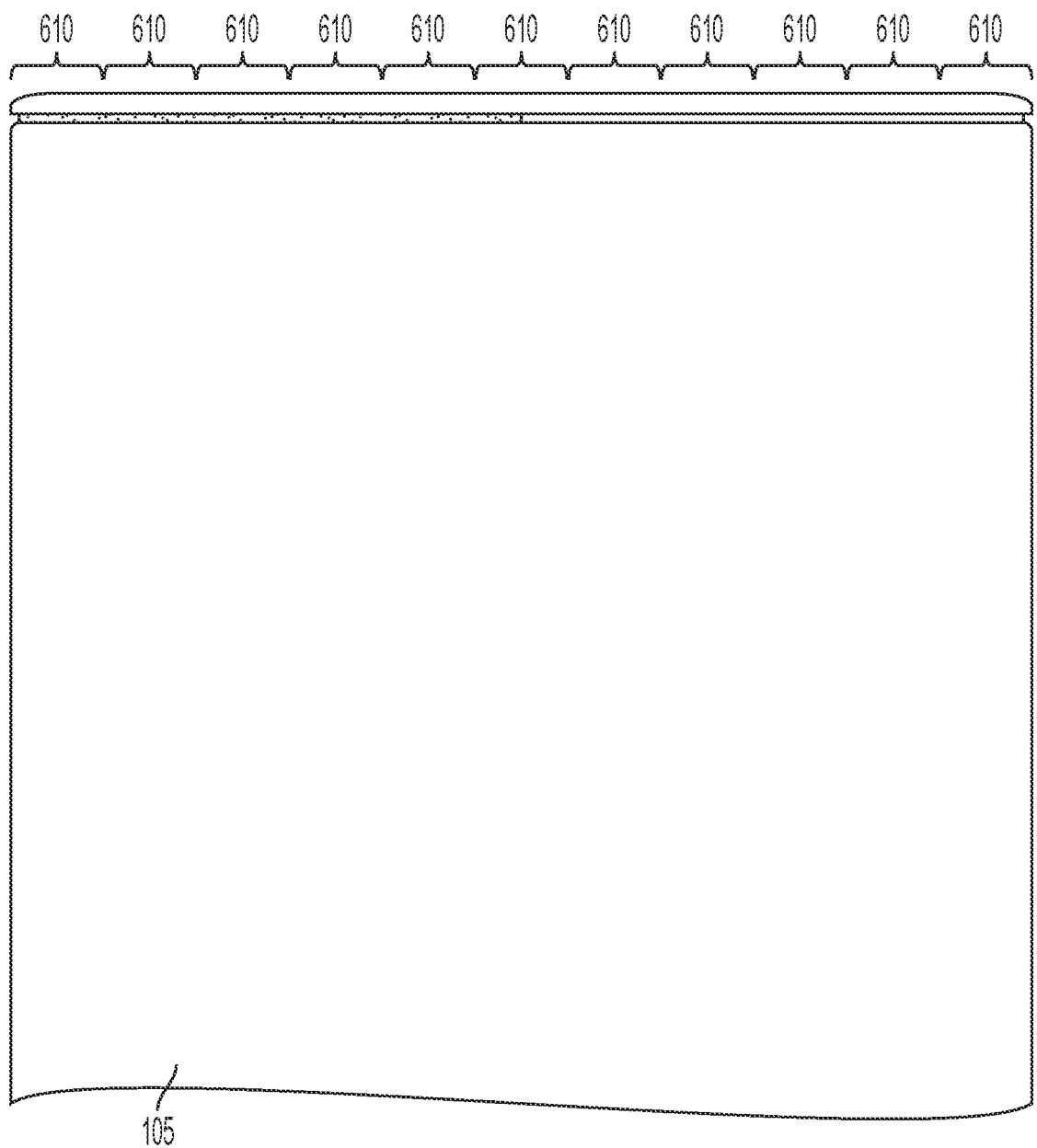
FIG. 7 depicts another animation of the status indicators of an energy storage device, in accordance with some aspects.

FIG. 7 depicts another animation of the status indicators of an energy storage device 105, in accordance with some aspects. The depicted energy storage device 105 has a status bar 230 having ten segments. Leftmost segment 710 and four additional segments 715, 720, 720, and 725 illuminated. The segments can be illuminated as a steady state display (e.g., of a SoC) or incident to an animation (e.g., an animation wiping from left to right.)

The various animations or other displays can employ segments or LEDs within segments having different colors. For example, individual LEDs of an RGB LED cluster can be individually controlled to generate additional colors. Further, segments or RGB clusters can individually display different colors. For example, a right most segment 755 can illuminate green, while an adjacent segment 750 can illuminate blue. A first RGB LED cluster of the third rightmost segment 745 can depict blue while a second RGB LED cluster of the third rightmost segment 745 can depict green. Such patterns can be alternated to create flashing patterns, illusions of motions and additional patterns, which may be used to communicate information or accord to a user preference (e.g., for aesthetic purposes, such as to match additional lighting which may not be adjustable). Some patterns or animations can be seasonal, such as to provide holiday themes, themes associated with various associations (e.g., sports teams). The patterns can be selected based on a user preference, a selected theme, or a user 120 can explicitly specify the pattern.

Figure 8:
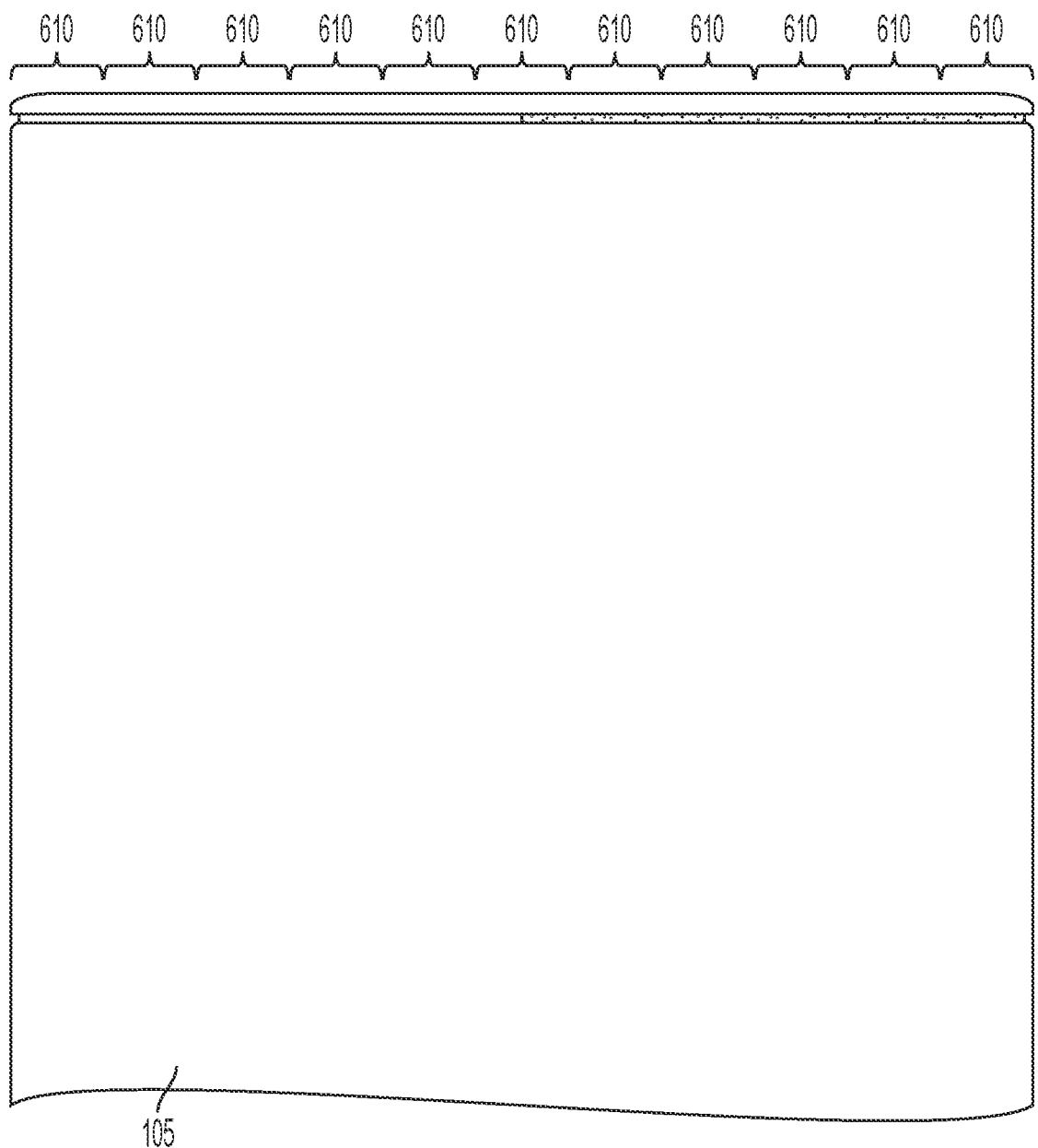
FIG. 8 depicts yet another animation of the status indicators of an energy storage device, in accordance with some aspects.

FIG. 8 depicts another animation of the status indicators of an energy storage device 105, in accordance with some aspects. The depicted energy storage device 105 has a status bar 230 having ten segments. The segments are indicated as having a right most segment 855 and four additional segments 850, 845, 840, and 835 illuminated. The segments can be illuminated as a steady state display (e.g., of an SoC) or incident to an animation (e.g., an animation wiping from right to left.)

The various animations or other displays can employ segments or LEDs can depict cumulative data associated with the energy storage device 105. For example, the status bar 230 can depict milestones associated with the device. For example the display can depict a number of tons of carbon dioxide emissions (e.g., based on an associated solar system, or peak capacity provided to a grid 150, which may displace other energy sources). The animations can also mark milestones such as years of ownership. The milestones described herein can be of the energy storage device 105, another associated device such as an electric vehicle 155, or a cumulative effect of associated devices. Information can be displayed directly by the animations, or the animations can prompt a user 120 to access an application 135 associated with the energy storage device 105, which may depict further information associated with the device (e.g., annual summaries, prompts for maintenance, the cumulative information, or prompts to engage a theme).

Figure 9:
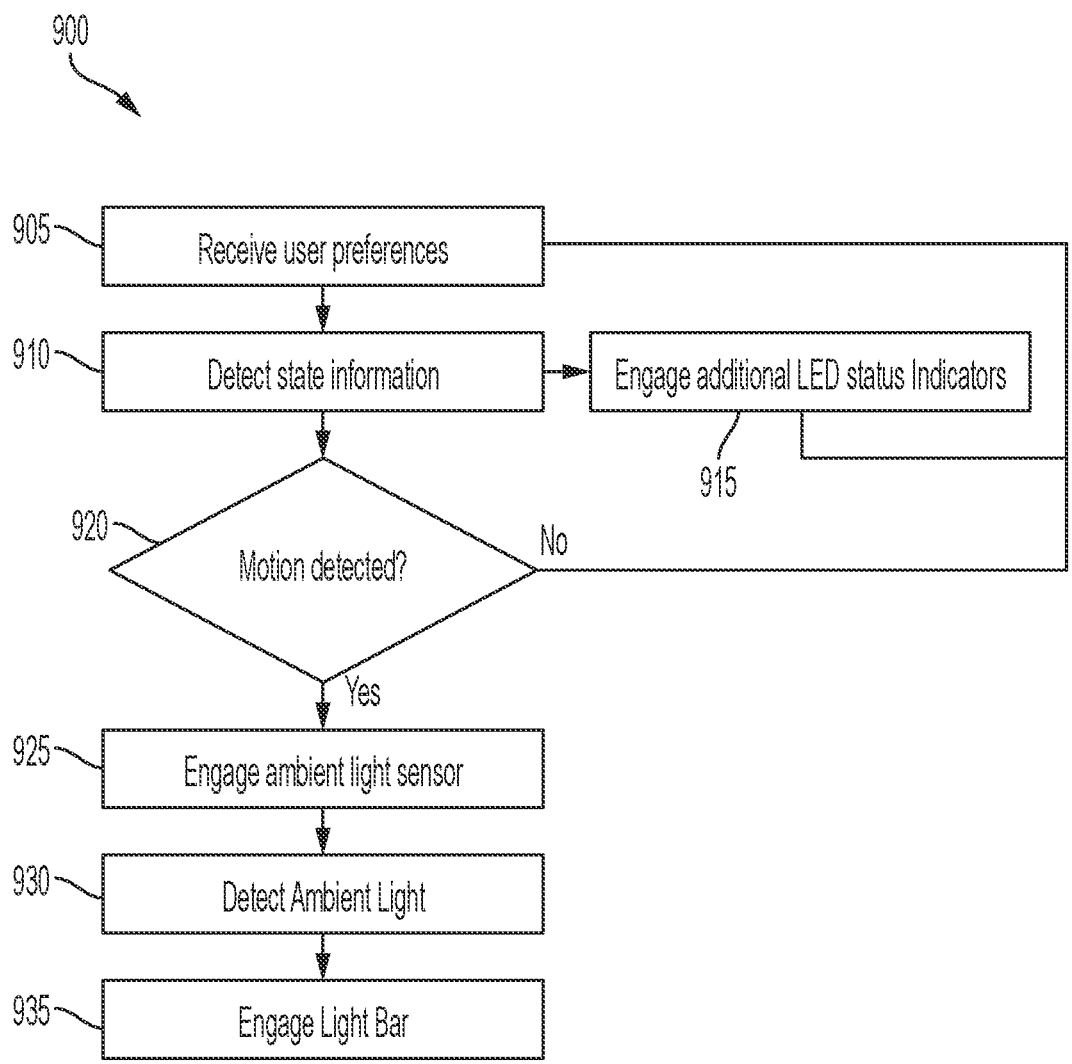
FIG. 9 depicts a method of controlling status indicators, in accordance with some aspects.

FIG. 9 depicts a method 900 of controlling status indicators associated with an energy storage device 105, in accordance with some aspects. The method 900 can be performed by one or more components or systems depicted in FIGS. 1-8, including, for example, an energy storage device 105. In brief summary, at ACT 905, the energy storage device 105 receives one or more user preferences. At ACT 910, the energy storage device 105 detects state information. At ACT 915, the energy storage device 105 engages additional LED status indicators. At ACT 920, the energy storage device 105 detects motion. Upon a detection of motion, the energy storage device 105 can engage an ambient light sensor 240 at ACT 925. At ACT 930, the ambient light is detected. At ACT 935, the energy storage device 105 engages an associated light bar (e.g., status bar).

At ACT 905, user preferences are received. User preferences can be based on information associated with a user such as a geographic region or a color of an associated vehicle. User preferences can be received from a mobile device 130, such as directly or via a server. The user preferences can adjust a sensitivity of a sensor such as a motion sensor 235 or an ambient light sensor 240, or can adjust times, patterns, or other behavior associated with a device. For example, a user preference can establish a schedule for device behavior, such that the device can respond differently based on a time. For example, a user 120 may schedule a time during which the user 120 should be notified in response to a detected motion, (e.g., to detect and inform the user of an early guest). The user can also establish a schedule based brightness, to determine a brightness based on a period of time. A user preference can involve a detection hysteresis that can avoid excessive detections or avoid masking detections. User preferences can enable and disable various features. For example, the status bar 230 can provide feedback to a user 120 entering a garage, such as a distance to a device associated with the status bar. (e.g., based on a detection of the motion sensor 235 or received from another source). Further user preferences can include a desired logging level. For example, some users 120 may prefer to receive more granular information via the status indicators (e.g., information which may not be presented to other users, or may be presented on other status indicators, or having less prominence). User preferences can include calibrations of various components of the energy storage device 105 or another device.

At ACT 910, state information associated with an energy storage or another device is detected. For example, the state information can include data concerning the internal components of the device, an ambient temperature, a communications link with another device, or data received over the communications link. State information can include information concerning the state of a battery pack 260, attached equipment, or a user. State information can be presented to a user, logged, or presented to a technician. For example, various background tasks, and additional details can be included in state information which is not presented to a user in at least some instances.

At ACT 915, additional LED status indicators 250 are engaged based on the state information. The additional LED status indicators 250 can include various information associated with one or more states. The additional LED status indicators 250 can be engaged based on the state, or the engagement may be gated by the presence of a removable panel. The LED status indicators can provide a series of alternating codes or each indicator (or a plurality thereof) can display a status code.

At ACT 920, motion is detected. The motion can be detected with reference to a threshold. For example, a motion can be detected which is less than a threshold (e.g., a threshold distance or a threshold size) or may be detected in excess of the threshold. The threshold may be configurable, such as through a user preference, or may be a configurable setting which is not exposed to a user 120. The depiction of motion sensing at a single ACT of the method 900 is not intended to be limiting. Indeed, the ACTs disclosed herein are not intended to be limited to a particular sequence. Various ACTs can be performed simultaneously, interleaved, or selected based on a priority (e.g., of a hardware or software interrupt).

At ACT 925, an ambient light sensor 240 is engaged. The engagement of the ambient light sensor 240 can comprise the application of power to the ambient light sensor 240 or sampling the output of the ambient light sensor 240. For example, the ambient light sensor 240 can remain in an off state or another low power state pending the activation of the motion detector which may reduce a power use and heat generation of the ambient light sensor 240. The light sensor can periodically sample the state of the light, such as to detect an additional state (e.g., an extended time of light may indicate a garage door has been left open, or a light has been left on) which can further reduce power usage.

At ACT 930, an ambient light is detected. Detecting the ambient light can involve one or more measurements, and can include a comparison to a reference. For example, the ambient light sensor 240 can take a number of discrete measure, or can take a single time averaged measurement. The brightness can be adjusted at a variable frequency. For example, if the detection of ambient light takes place at a first time wherein the headlights of a vehicle are shone on the light sensor, a first brightness can be detected. Upon the shutdown of the vehicle or the vehicle continuing along a path, the brightness can be different (e.g., can be substantially lower). The brightness can continually adapt to the ambient light over time (e.g., gradually, or at defined increments or times).

At ACT 935 a light bar (e.g., a status bar 230 comprising a plurality of segments) is engaged. Engagement of the light bar can include applying power to the light bar, or adjusting the color, pattern, animation, brightness, or other aspect of the light bar. The engagement can prompt the user 120 to take further action, such as interfacing with an energy storage device 105 via an application 135 of a mobile device 130 (e.g., to check a status code or a state of the energy storage device 105). Indeed, ACTs can be added (or substituted/omitted) which are not explicitly defined in method 900, based on the disclosure provided herein. For example, the various detected states can be logged, such as on a local non-transitory memory, or transmitted to a server for logging.

Figure 10:
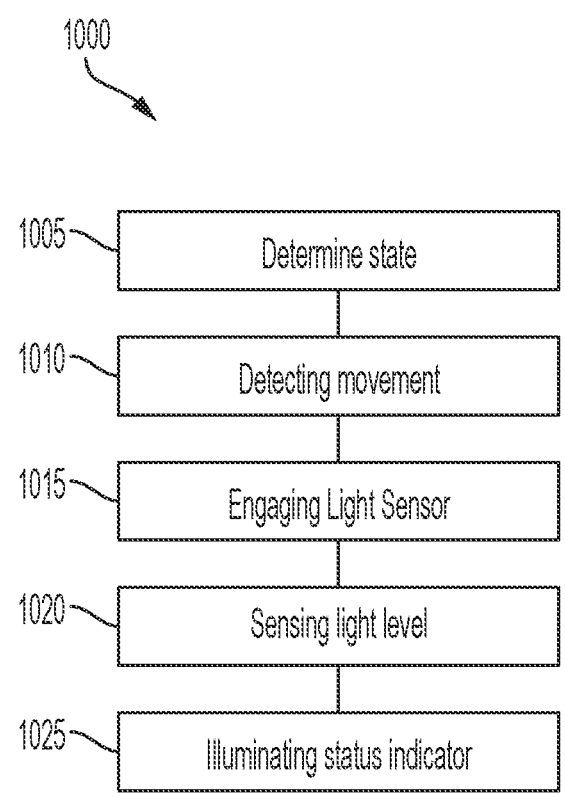
FIG. 10 depicts another method of controlling status indicators, in accordance with some aspects.

FIG. 10 depicts a method 1000 of controlling status indicators, in accordance with some aspects. The method 1000 can be performed by one or more components or systems depicted in FIGS. 1-8, including, for example, an energy storage device 105.

At ACT 1005, at least one state of the energy storage device 105 can be determined. The state of the energy storage device 105 can include a SoC of a battery pack 260, a module, a submodule, or a cell. The state can also include additional information such as a thermal characteristic, the presence of one or more connections, and a state of an associated device, such as the generation rate of an associated solar panel or the price of energy from a grid 150. The energy storage device 105 can provide power to a port 110 based on the state of the energy storage device 105, and the charge or discharge rate associated with the port 110 can comprise the state of the energy storage device 105. For example, the energy storage device 105 can continue to adjust or maintain a function (e.g., charging) based on the state of the energy storage device 105 (such as thermal information) during various operations of method 1000.

At ACT 1010, at least one movement can be detected. For example, the movement can be detected by a motion sensor 235 of the energy storage device 105, or based on a detected movement of a mobile device 130 of a user 120. A sensed magnitude associated with the movement such as a magnitude of a temperature, a Doppler effect, or a change in position can be compared to a threshold to determine if the movement meets the threshold. For example, a threshold can suppress spurious detections, such as by the movement of a squirrel on a tree branch. The threshold can be adjustable, such as based on a user input. For example, a squirrel within an enclosed space such as a garage or a cabin can be of interest to a user. The threshold can be associated with a distance. For example, the distance can be measured directly or inferred based on other data. For example, the magnitude of a sensed movement can be used to infer a distance.

At ACT 1015, at least one light sensor can be engaged. The engagement of the light sensor can include the application of power to the light sensor or the withdrawal of the light sensor from a low power state. The light sensor can be or include ambient light sensor 240 that can measure a ambient light 125. For example, the light sensor can be positioned to avoid expected sources of direct light. The engagement of the light sensor can be responsive to the detection of movement at ACT 1010, such that the power use of the device can be reduced relative to a system which samples ambient light when no movement is detected.

At ACT 1020, at least one light level can be sensed. Sensing the light can include detecting the output of one or more light sensors to detect an ambient light level 125. For example, the output of one or more light sensors can be time average or spatially averaged (e.g., a plurality of light sensors at a plurality of locations can be averaged or otherwise combined). The averaging of the light sensors can include discarding errant values, such as outliers or readings from sensors that to not appear time-variant.

At ACT 1025, at least one status indicator can be illuminated. The illumination of the status indicator can include illuminating one or a plurality of segments of a status bar 230. The number, position, and fashion (e.g., animation) of the illumination of the one or more segments of the status bar 230 can convey information to a user 120 or abide by an aesthetic preference of a user 120. For example, the color, pace, or brightness of a status indicator can be based on a user preference or another association with a user 120. The status indicator can include additional LED status indicators 250. For example, the additional LED status indicators 250 can depict additional state information associated with the device that may not be of interest to a particular user 120 or a set of users 120.

Figure 11:
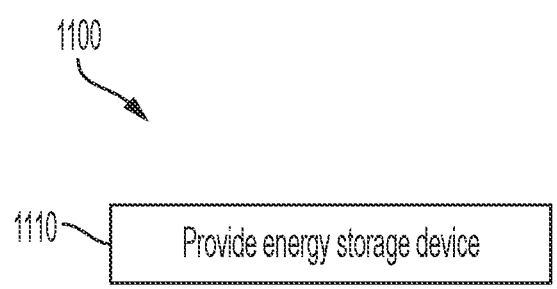
FIG. 11 depicts a method of providing an energy storage device, in accordance with some aspects.

FIG. 11 depicts a method 1100 of providing at least one energy storage device 105 (ACT 1010). The energy storage device 105 can be provided to power or control power distribution to a building such as a home, office, or other dwelling, as well as to or from at least one electric vehicle 155. For example, the energy storage device 105 can be provided (ACT 1010) for installation in a dwelling or building.

Figure 12:
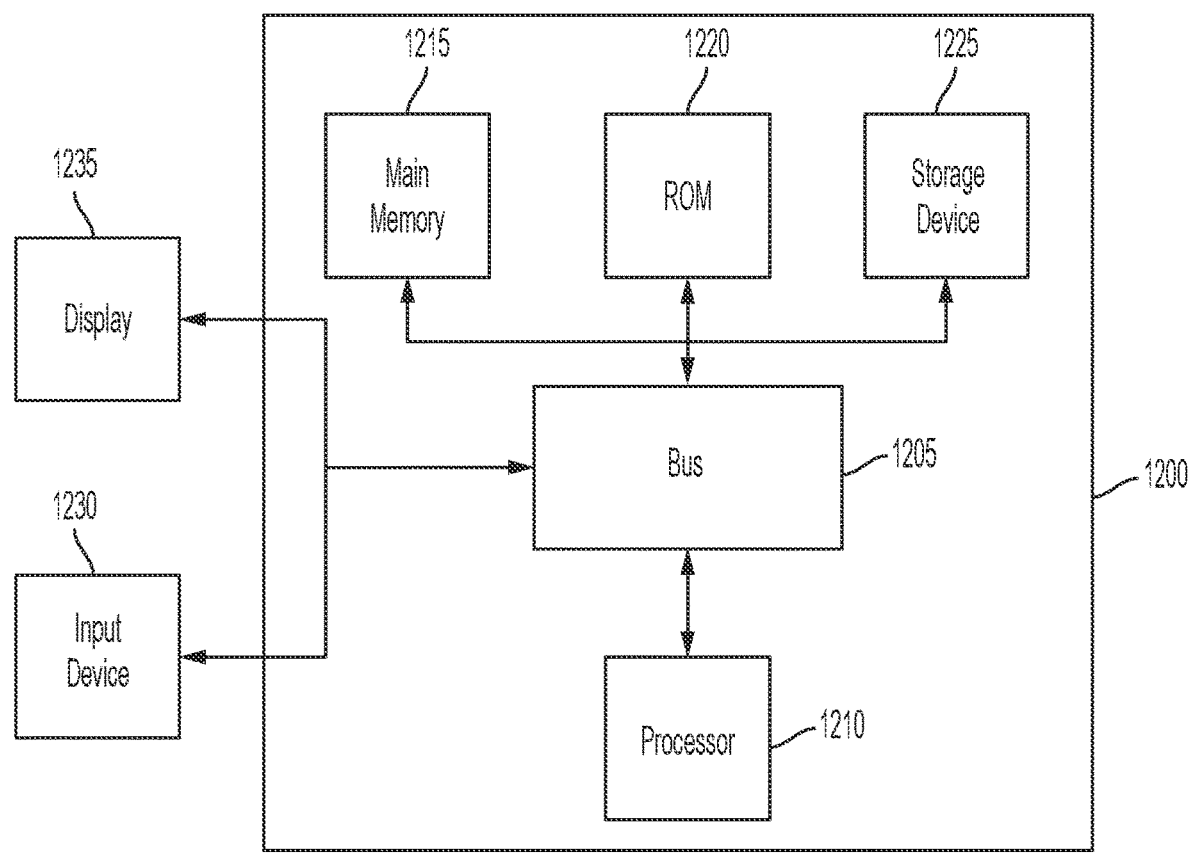
FIG. 12 is a block diagram illustrating an architecture for a computer system that can be employed to implement elements of the systems and methods described and illustrated herein.

FIG. 12 depicts an example block diagram of an example computer system 1200. The computer system or computing device 1200 can include or be used to implement a data processing system or its components. The computing system 1200 includes at least one bus 1205 or other communication component for communicating information and at least one processor 1210 or processing circuit coupled to the bus 1205 for processing information. The computing system 1200 can also include one or more processors 1210 or processing circuits coupled to the bus for processing information. The computing system 1200 also includes at least one main memory 1215, such as a random access memory (RAM) or other dynamic storage device, coupled to the bus 1205 for storing information, and instructions to be executed by the processor 1210. The main memory 1215 can be used for storing information during execution of instructions by the processor 1210. The computing system 1200 may further include at least one read only memory (ROM) 1220 or other static storage device coupled to the bus 1205 for storing static information and instructions for the processor 1210. A storage device 1225, such as a solid state device, magnetic disk or optical disk, can be coupled to the bus 1205 to persistently store information and instructions.

The computing system 1200 may be coupled via the bus 1205 to a display 1235, such as a liquid crystal display, or active matrix display, for displaying information to a user such as a driver of the electric vehicle or other end user. An input device 1230, such as a keyboard or voice interface may be coupled to the bus 1205 for communicating information and commands to the processor 1210. The input device 1230 can include a touch screen display 1235. The input device 1230 can also include a cursor control, such as a mouse, a trackball, or cursor direction keys, for communicating direction information and command selections to the processor 1210 and for controlling cursor movement on the display 1235.

The processes, systems and methods described herein can be implemented by the computing system 1200 in response to the processor 1210 executing an arrangement of instructions contained in main memory 1215. Such instructions can be read into main memory 1215 from another computer-readable medium, such as the storage device 1225. Execution of the arrangement of instructions contained in main memory 1215 causes the computing system 1200 to perform the illustrative processes described herein. One or more processors in a multi-processing arrangement may also be employed to execute the instructions contained in main memory 1215. Hard-wired circuitry can be used in place of or in combination with software instructions together with the systems and methods described herein. Systems and methods described herein are not limited to any specific combination of hardware circuitry and software.

Although an example computing system has been described in FIG. 12, the subject matter including the operations described in this specification can be implemented in other types of digital electronic circuitry, or in computer software, firmware, or hardware, including the structures disclosed in this specification and their structural equivalents, or in combinations of one or more of them.

Some of the description herein emphasizes the structural independence of the aspects of the system components or groupings of operations and responsibilities of these system components. Other groupings that execute similar overall operations are within the scope of the present application. Modules can be implemented in hardware or as computer instructions on a non-transient computer readable storage medium, and modules can be distributed across various hardware or computer based components.

The systems described above can provide multiple ones of any or each of those components and these components can be provided on either a standalone system or on multiple instantiation in a distributed system. In addition, the systems and methods described above can be provided as one or more computer-readable programs or executable instructions embodied on or in one or more articles of manufacture. The article of manufacture can be cloud storage, a hard disk, a CD-ROM, a flash memory card, a PROM, a RAM, a ROM, or a magnetic tape. In general, the computer-readable programs can be implemented in any programming language, such as LISP, PERL, C, C++, C#, PROLOG, or in any byte code language such as JAVA. The software programs or executable instructions can be stored on or in one or more articles of manufacture as object code.

Example and non-limiting module implementation elements include sensors providing any value determined herein, sensors providing any value that is a precursor to a value determined herein, datalink or network hardware including communication chips, oscillating crystals, communication links, cables, twisted pair wiring, coaxial wiring, shielded wiring, transmitters, receivers, or transceivers, logic circuits, hard-wired logic circuits, reconfigurable logic circuits in a particular non-transient state configured according to the module specification, any actuator including at least an electrical, hydraulic, or pneumatic actuator, a solenoid, an op-amp, analog control elements (springs, filters, integrators, adders, dividers, gain elements), or digital control elements.

The subject matter and the operations described in this specification can be implemented in digital electronic circuitry, or in computer software, firmware, or hardware, including the structures disclosed in this specification and their structural equivalents, or in combinations of one or more of them. The subject matter described in this specification can be implemented as one or more computer programs, e.g., one or more circuits of computer program instructions, encoded on one or more computer storage media for execution by, or to control the operation of, data processing apparatuses. The program instructions can be encoded on an artificially generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. While a computer storage medium is not a propagated signal, a computer storage medium can be a source or destination of computer program instructions encoded in an artificially generated propagated signal. The computer storage medium can also be, or be included in, one or more separate components or media (e.g., multiple CDs, disks, or other storage devices include cloud storage). The operations described in this specification can be implemented as operations performed by a data processing apparatus on data stored on one or more computer-readable storage devices or received from other sources.

The terms "computing device", "component" or "data processing apparatus" or the like encompass various apparatuses, devices, and machines for processing data, including by way of example a programmable processor, a computer, a system on a chip, or multiple ones, or combinations of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, app, script, or code) can be written in any form of programming language, including compiled or interpreted languages, declarative or procedural languages, and can be deployed in any form, including as a stand-alone program or as a module, component, subroutine, object, or other unit suitable for use in a computing environment. A computer program can correspond to a file in a file system. A computer program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatuses can also be implemented as, special purpose logic circuitry, e.g., an FPGA (field programmable gate array) or an ASIC (application specific integrated circuit). Devices suitable for storing computer program instructions and data can include non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

The subject matter described herein can be implemented in a computing system that includes a back end component, e.g., as a data server, or that includes a middleware component, e.g., an application server, or that includes a front end component, e.g., a client computer having a graphical user interface or a web browser through which a user can interact with an implementation of the subject matter described in this specification, or a combination of one or more such back end, middleware, or front end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While operations are depicted in the drawings in a particular order, such operations are not required to be performed in the particular order shown or in sequential order, and all illustrated operations are not required to be performed. Actions described herein can be performed in a different order.

Having now described some illustrative implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation or embodiment, and references to "an implementation," "some implementations," "one implementation" or the like are not necessarily mutually exclusive and are intended to indicate that a particular feature, structure, or characteristic described in connection with the implementation may be included in at least one implementation or embodiment. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of 'A' and 'B'" can include only 'A', only 'B', as well as both 'A' and 'B'. Such references used in conjunction with "comprising" or other open terminology can include additional items.

Where technical features in the drawings, detailed description or any claim are followed by reference signs, the reference signs have been included to increase the intelligibility of the drawings, detailed description, and claims. Accordingly, neither the reference signs nor their absence have any limiting effect on the scope of any claim elements.

Modifications of described elements and acts such as variations in sizes, dimensions, structures, shapes and proportions of the various elements, values of parameters, mounting arrangements, use of materials, colors, orientations can occur without materially departing from the teachings and advantages of the subject matter disclosed herein. For example, elements shown as integrally formed can be constructed of multiple parts or elements, the position of elements can be reversed or otherwise varied, and the nature or number of discrete elements or positions can be altered or varied. Other substitutions, modifications, changes and omissions can also be made in the design, operating conditions and arrangement of the disclosed elements and operations without departing from the scope of the present disclosure.

For example, descriptions of positive and negative electrical characteristics may be reversed. For example, charging and discharging, or power and ground lines may be inverted to similar effect. Elements described as negative elements can instead be configured as positive elements and elements described as positive elements can instead by configured as negative elements. For example, elements described as having first polarity can instead have a second polarity, and elements described as having a second polarity can instead have a first polarity. Further relative parallel, perpendicular, vertical or other positioning or orientation descriptions include variations within +/−10% or +/−10 degrees of pure vertical, parallel or perpendicular positioning. References to "approximately," "substantially" or other terms of degree include variations of +/−10% from the given measurement, unit, or range unless explicitly indicated otherwise. Coupled elements can be electrically, mechanically, or physically coupled with one another directly or with intervening elements. Scope of the systems and methods described herein is thus indicated by the appended claims, rather than the foregoing description, and changes that come within the meaning and range of equivalency of the claims are embraced therein.

What is claimed is:

1. An energy storage device, comprising:
a motion sensor, an ambient light sensor, a status indicator to display a state of charge of the energy storage device, and one or more processors coupled to memory, the energy storage device configured to:
determine a state of the energy storage device comprising the state of charge of the energy storage device and a provisioning of energy to a port;
detect, via the motion sensor, a movement within a threshold distance of the energy storage device;
detect, via the ambient light sensor, an ambient light level;
display, responsive to the movement, an indication of the state of charge on the status indicator;
detect, based on the state of the energy storage device, a mask-able status condition;
cause, based on a qualification of mask-ability, the mask-able status condition to be reported on a second portion of one or more display segments of the status indicator, and not a first portion of the one or more display segments;
detect, based on the state of the energy storage device, a non mask-able status condition; and
cause, based on a qualification of non mask-ability, the non mask-able status condition to be reported on the first portion of the one or more display segments.

2. The energy storage device of claim 1 wherein:
the one or more processors determine a brightness for the display of the state of charge based on the ambient light level.

3. The energy storage device of claim 1, wherein the one or more processors determine a number of the one or more display segments to display based on the state of the energy storage device.

4. The energy storage device of claim 1, comprising:
the energy storage device to engage the ambient light sensor in response to the movement.

5. The energy storage device of claim 4, comprising the energy storage device to:
communicate, via a first network and on a first pin, between the one or more processors and a status indicator controller; and
communicate, over the first network and via the first pin, between the one or more processors and a thermal management system of the energy storage device, the one or more processors configured to:
detect a status code, via the first network on the first pin; and
transmit, responsive to the detection of the status code, a command to the status indicator via the first network on the first pin.

6. The energy storage device of claim 1, comprising the energy storage device to:
receive, over a first network, a user preference; and
display, on the status indicator, a selected color responsive to the receipt of the user preference.

7. The energy storage device of claim 1, wherein the state of the energy storage device comprises the state of charge, a status code, and a mode of operation.

8. The energy storage device of claim 1, comprising:
the energy storage device to alternate at least one of the one or more display segments of the status indicator to generate an animation.

9. The energy storage device of claim 1, wherein the status indicator comprises:
a status bar having the one or more display segments linearly disposed; and
a plurality of additional LED status indicators, wherein a status is indicated by the state of a plurality of light emitting diodes.

10. The energy storage device of claim 1, wherein the energy storage device includes a battery pack;
the battery pack is configured to provide power to the status indicator; and
the battery pack is configured to receive power from at least one of a regional power grid, a micro grid, and an electric vehicle.

11. The energy storage device of claim 1, comprising the energy storage device to:
detect a power availability event associated with a first power source; and
provide, based on a detection of the power availability event, energy to a port.

12. The energy storage device of claim 1, comprising the energy storage device to:
detect a power availability event associated with a first power source; and
wherein the power availability event is a demand reduction request associated with a power grid.

13. A method, comprising:
determining, by an energy storage device, a state of the energy storage device comprising a state of charge of the energy storage device, and a provisioning of energy to a port;
detecting, by the energy storage device and via a motion sensor, a movement within a threshold distance of the energy storage device;
engaging, by the energy storage device and responsive to the movement, an ambient light sensor;
sensing, by the energy storage device and responsive to engaging the ambient light sensor, an ambient light level;
displaying, by the energy storage device and responsive to the state of the energy storage device, a number of segments of a status indicator;
detecting, by the energy storage device, a first status condition;
qualifying, by the energy storage device, the first status condition as a mask-able status condition;
causing, based on a qualification of mask-ability, the first status condition to be reported on a second portion of the number of segments, and not a first portion of the number of segments;
detecting, by the energy storage device, a second status condition;
qualifying, by the energy storage device, the second status condition as a non mask-able status condition; and
causing, based on a qualification of non mask-ability, the second status condition to be reported on the first portion of the number of segments.

14. The method of claim 13, wherein a first portion of the number of segments the status indicator are disposed linearly, and a second portion of the number of segments are concealed during normal operation.

15. The method of claim 13, comprising:
associating, via a first wireless network, a mobile device of a user;
receiving, by the energy storage device and via a second wireless network, a user preference associated with the user; and
wherein displaying the number of segments of the status indicator is based on the receipt of the user preference.

16. An energy storage device, comprising:
a battery;
a battery management system to monitor and control a charging or a discharging of the battery;
a wireless transceiver communicatively coupled to a microcontroller;
the microcontroller communicatively coupled to a display board having a status indicator, a motion sensor, and an ambient light sensor; and
a memory having stored thereupon instructions that, when executed by the microcontroller or other processors of the energy storage device, cause the microcontroller or other processors to:
receive, from the wireless transceiver, a user preference regarding a display of the status indicator;
detect, by the motion sensor, an approaching user within a threshold distance of the energy storage device;
measure, by the ambient light sensor, an ambient light level;

display, on a number of segments of the status indicator, a status indication based on the charging or the discharging of the battery, and the user preference;

detect a mask-able status condition;

cause, based on a qualification of the mask-able status condition, the mask-able status condition to be reported on a second portion of the number of segments, and not a first portion of the number of segments;

detect a non mask-able status condition;

cause, based on a qualification of the non mask-able status condition, the non mask-able status condition to be reported on the first portion of the number of segments.

17. The energy storage device of claim 16, wherein the status indication comprises an animation comprising a plurality of patterns among a plurality of the number of segments of the status indicator.

18. The energy storage device of claim 16, wherein a color of the status indicator is associated with the user preference, and an animation is related to the charging or the discharging of the battery.

19. The energy storage device of claim 18, wherein each of the number of segments of the status indicator comprises a plurality of LEDs disposed in the same linear direction as the status indicator.

* * * * *